United States Patent
Ball

(10) Patent No.: US 6,394,119 B2
(45) Date of Patent: May 28, 2002

(54) METHOD FOR CONSERVING A RESOURCE BY FLOW INTERRUPTION

(75) Inventor: Michael B. Ball, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/873,736

(22) Filed: Jun. 4, 2001

Related U.S. Application Data

(62) Division of application No. 09/311,071, filed on May 13, 1999, now Pat. No. 6,240,942.

(51) Int. Cl.[7] .................................................. G05D 7/06
(52) U.S. Cl. ...................................... 137/1; 137/624.11
(58) Field of Search ........................ 137/1, 486, 624.11, 137/624.13, 624.15, 624.12; 451/53

(56) References Cited

U.S. PATENT DOCUMENTS

| | | | | |
|---|---|---|---|---|
| 4,195,558 A | * | 4/1980 | Speakman | 99/325 |
| 4,230,155 A | * | 10/1980 | Frye, Sr. et al. | 137/624.11 X |
| 4,374,386 A | * | 2/1983 | Bildstein et al. | 346/75 |
| 5,070,897 A | * | 12/1991 | Welch | 137/624.11 X |
| 5,156,814 A | * | 10/1992 | Fielden et al. | 137/624.15 X |
| 5,360,027 A | * | 11/1994 | Harman | 134/102.3 |
| 5,402,812 A | * | 4/1995 | Moineau et al. | 137/624.12 X |
| 5,545,076 A | | 8/1996 | Yun et al. | |
| 5,679,060 A | | 10/1997 | Leonard et al. | |
| 5,827,111 A | | 10/1998 | Ball | |
| 5,827,112 A | | 10/1998 | Ball | |
| 6,026,588 A | * | 2/2000 | Clark et al. | 34/77 |

* cited by examiner

*Primary Examiner*—Kevin Lee
(74) *Attorney, Agent, or Firm*—Schwegman, Lundberg, Woessner & Kluth, P.A.

(57) ABSTRACT

A method of conserving a facility delivered to a machine during the machine's idle mode is herein described. In one embodiment, the method is directed to a method for conserving coolant water delivery to a semiconductor wafer grinding machine. The system monitors the status of the grinder to determine whether the grinder is active or idle. After the system determines the grinder has entered idle mode, the system reduces the flow of water to the machine. In one embodiment, the flow is simply reduced while, in another embodiment, the flow is terminated. A delay circuit in the system may delay the reduction of the flow rate until some point after entering idle mode. Periodically throughout the idle mode, the system increases the flow of coolant water to the grinder to ensure the temperature of all grinder components remains consistent. The duty cycle of the coolant flow may be adjusted to optimize water conservation and machine readiness.

8 Claims, 2 Drawing Sheets

METHOD FOR CONSERVING A RESOURCE BY FLOW INTERRUPTION

This application is a Divisional of U.S. application Ser. No. 09/311,071, filed May 13, 1999, U.S. Pat. No. 6,240,942.

TECHNICAL FIELD

This invention relates to a method for conserving a resource by interrupting the flow of the resource. More specifically, it relates to a method for reducing water consumption by a semiconductor wafer grinding machine during a non-processing idle mode.

BACKGROUND OF THE INVENTION

Modern manufacturing equipment relies on various resource or facility inputs in order to operate. For example, electricity is directly or indirectly required to run most, if not all such machinery. In addition, many machine processes require additional facilities such as compressed gas or air, vacuum pressure, and chemical, hydraulic, and aqueous flow to name a few. These facilities are the direct or indirect product of conventional expendable resources (e.g., electricity, gas, water). Accordingly, it is economically and environmentally advantageous to conserve or minimize usage of these facilities. While the present invention is applicable to conserving most any facility, it is primarily directed to conservation of liquid flow and, more particularly, water flow to a semiconductor wafer grinding machine. The remainder of this discussion will focus on the same.

In conventional wafer grinding, a wafer having a front side covered with a protective layer is placed on a vacuum chuck. The back side of the wafer is then brought into contact with a grinding wheel. As the grinding wheel passes over the wafer, it removes a thin layer of wafer material. Due to the frictional engagement of the grinding wheel with the wafer, heat is produced. To cool the wafer and the surrounding tool surfaces, a liquid coolant system is typically included. The coolant system provides directed flow of municipal or de-ionized water over the various components including the wafer and grinding wheel, thus maintaining a consistent temperature. In addition to cooling, the coolant rinses away the wafer material removed by the grinding wheel.

To monitor the amount of material removed from the wafer, the grinding machine also includes sensors or transducers that constantly monitor wafer thickness. It is critical that these sensors deliver accurate data throughout the grinding operation. Unfortunately, the output from these transducers is highly influenced by changes in temperature. To ensure accurate and repeatable data, the sensors are calibrated and operated within a narrow temperature range. Outside that range, sensor accuracy becomes unreliable. Accordingly, it is important to maintain the wafer thickness sensors at a consistent temperature throughout the grinding process.

During operation, the grinder typically grinds wafers continuously for a period of time. When grinding is complete, the machine enters a non-operational or "idle mode" at which time no wafer processing is occurring.

To conserve water, the coolant water flow may be shut off during idle mode. Unfortunately, when water flow is discontinued, the temperature of the sensors (and the other tool surfaces) changes. As discussed above, temperature variation has an adverse effect on sensor accuracy. Furthermore, the time required to bring the grinder back to operating temperature once water flow is restored may be extensive due to the size and mass of the machine.

Another problem with discontinuing the water supply to the grinder is that waste material not yet removed at the completion of the grinding operation may still be present. That is, material removed from the last processed wafers may not be completely rinsed from the grinding station at the time it enters idle mode.

To preserve sensor accuracy, eliminate "warm-up" time, and keep the grinder clean, some grinders apply a continuous water spray even during idle mode. While this assures consistent temperature and improves cleanliness, it also wastes a significant amount of water.

Thus, there are unresolved issues with current wafer grinding techniques. What is needed is a method of conserving water supplied to the grinder during idle mode that will not adversely affect the temperature of the various grinding surfaces and components. What is further needed is a method that will adequately purge the grinder of any waste material whenever the grinder enters idle mode.

SUMMARY OF THE INVENTION

A method and system for conserving a facility delivered to a device are described herein. The method, in one embodiment, comprises providing facility delivery means and delivering the facility to the device through the facility delivery means. In addition, control means are provided between the facility delivery means and the device to allow adjusting the rate of delivery of the facility. The facility is delivered at a first rate of delivery when the device is in an active mode and at a second rate of delivery when the device is in an idle mode.

A system for controlling delivery of water to a machine is also disclosed. In one embodiment, the system comprises a water delivery conduit; a flow control valve within the water delivery conduit; and a valve controller coupled to the flow control valve. The valve controller is adapted to monitor the machine to determine whether the machine is in an active mode or an idle mode. The valve controller can manipulate the flow control valve to deliver water at a first flow rate during active mode and at a second, reduced flow rate during idle mode.

In yet another embodiment, a method for conserving a facility delivered to a machine is described comprising providing a facility delivery device and delivering the facility to the machine through the facility delivery device. The method further includes providing control means between the facility delivery device and the machine. By adjusting the rate of delivery of the facility with the control means, the facility is delivered at a first rate of delivery when the machine is in an active mode and at a second, reduced rate of delivery when the machine is in an idle mode. The delivery of the facility may be modulated when the machine is in idle mode such that the control means intermittently increases the rate of delivery of the facility to a level higher than the second rate of delivery.

In still yet another embodiment, a grinder used during semiconductor fabrication is disclosed. The grinder comprises: a wafer chuck adapted to support a wafer; a grinding wheel proximal the wafer chuck; one or more sensors to monitor the wafer thickness; and a machine controller to monitor and control grinding operations. The grinder further includes a coolant system adapted to provide coolant to the grinder. The coolant system includes a coolant delivery conduit; a flow control valve within the coolant delivery conduit; and a valve controller coupled to the flow control valve. The valve controller is adapted to monitor the grinder to determine whether the grinder is in an active mode or an idle mode, wherein the valve controller can manipulate the flow control valve to reduce coolant flow when the grinder enters idle mode.

Advantageously, the present invention can effectively reduce consumption of a facility provided to equipment which periodically enters a non-operational idle mode. By monitoring the status of the equipment, the delivery of the facility may be reduced or terminated when the equipment enters idle mode. To maintain the operational readiness of the machine and eliminate the need for a subsequent "warm-up" period, the delivery of the facility may be periodically restored or increased during idle mode. In addition, a delay may be provided so that elevated delivery of the facility is maintained momentarily after entering idle mode. Accordingly, the present invention permits facility conservation during idle mode without the undesirable consequences that may result from total facility termination.

BRIEF DESCRIPTION OF THE DRAWINGS

The invention described herein will be further characterized with reference to the drawings, wherein.

DETAILED DESCRIPTION OF THE EMBODIMENTS

In the following detailed description of the embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

The present invention relates to an apparatus and method for conserving a facility delivered to a device by interrupting facility delivery when the device enters a non-operational idle mode. "Idle mode" refers to that period of time when the device is not actively processing (as opposed to operational or "active mode" when the device is actively processing). For example, a machine that is shut down during a particular shift may be placed in idle mode. "Facility" is broadly defined herein to include any resource commonly required in modern manufacturing processes including but not limited to: electricity, water, pressurized gas or air, vacuum pressure, and liquid (chemical, hydraulic, aqueous) flow.

Figure 1:
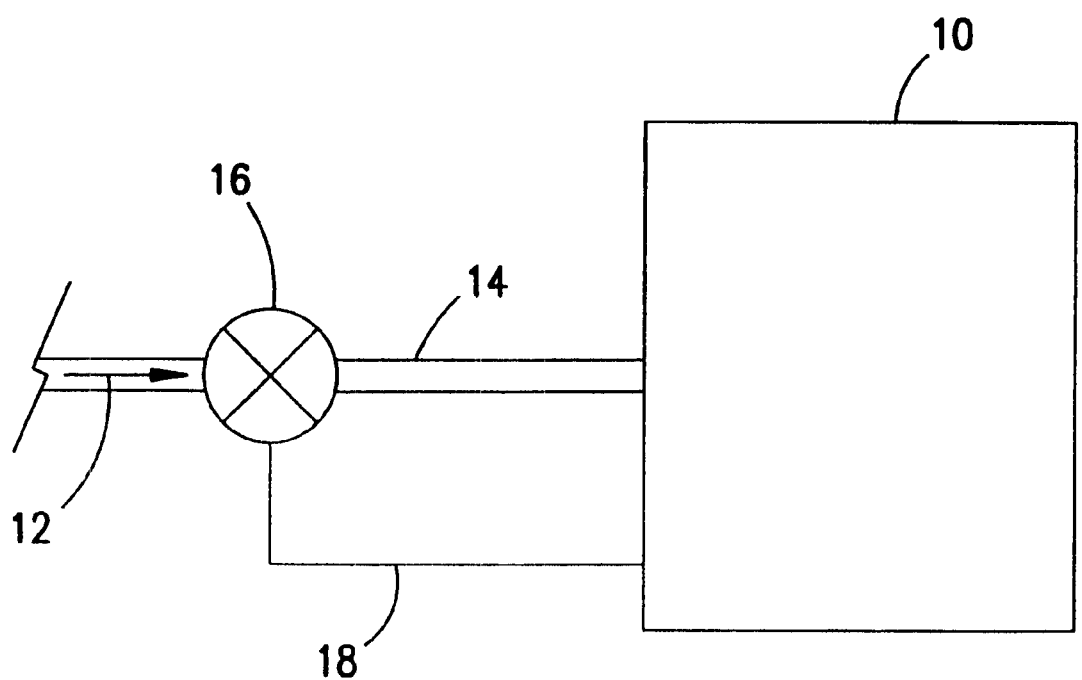
FIG. 1 is a diagrammatic illustration of a system for conserving a facility in accordance with one embodiment of the present invention.

Referring now to FIG. 1, a generic device or piece of equipment 10 which requires a facility 12 in order to operate receives the facility 12 through facility delivery means 14. In communication with the facility delivery means 14 is control means 16. Control means 16 controls the rate of delivery of the facility 12 to the device 10. When the device 10 has a change in operational status (e.g., it switches from active to idle mode), the device informs the control means 16 via a conductor 18. The control means may then modify the delivery of the facility 12 in response thereto. The control means 16 may also delay the modification of delivery for a finite period of time after receiving notification that the device 10 has entered idle mode. In one embodiment, the control means 16 reduces the rate of delivery of the facility from a first rate of delivery in active mode to a second rate of delivery in idle mode. In another embodiment, the control means 16 terminates delivery entirely after entering idle mode (i.e., the second rate of delivery equals zero). In case of the latter, the present apparatus and method provide means for modulating or varying the rate of delivery of the facility during idle mode to maintain optimal device readiness while at the same time conserving the facility. For example, after delivering the resource at the second rate of delivery for a first period, the apparatus may elevate or increase the rate of delivery to a third rate of delivery. This third rate of delivery, which is higher than the second rate of delivery, is then maintained for a second period before the second rate of delivery is restored. In one embodiment, the third rate of delivery is substantially equal to the first rate of delivery. This cycle then repeats for the entire idle mode. To optimize conservation, the first and second periods as well as the second and third rate of delivery may be adjustable.

Depending on the facility to be conserved, the facility delivery means and control means may take various forms. For example, where the facility is a fluid (gas or liquid) or vacuum, the delivery means may comprise, among other facility delivery devices, a conduit, pipe, hose, or manifold and the control means may comprise a fluid flow control device such as a valve (e.g., solenoid, servo, two-position, etc.) and valve controller. Where the facility is electricity, the delivery means may comprise a cable, wire, or other conductor. Likewise, the control means may comprise an on-off or rheostatic switch or other device that allows interruption of electrical conduction.

With this brief introduction, the present invention will now be described in terms of particular exemplary embodiments. While the system is useful with most any device and facility, for the sake of brevity it will be described herein with respect to conservation of coolant water delivered to a semiconductor wafer grinding machine. The reader is reminded, however, that this particular embodiment is illustrative only and is not intended to limit the scope of the invention in any respect.

Figure 2:
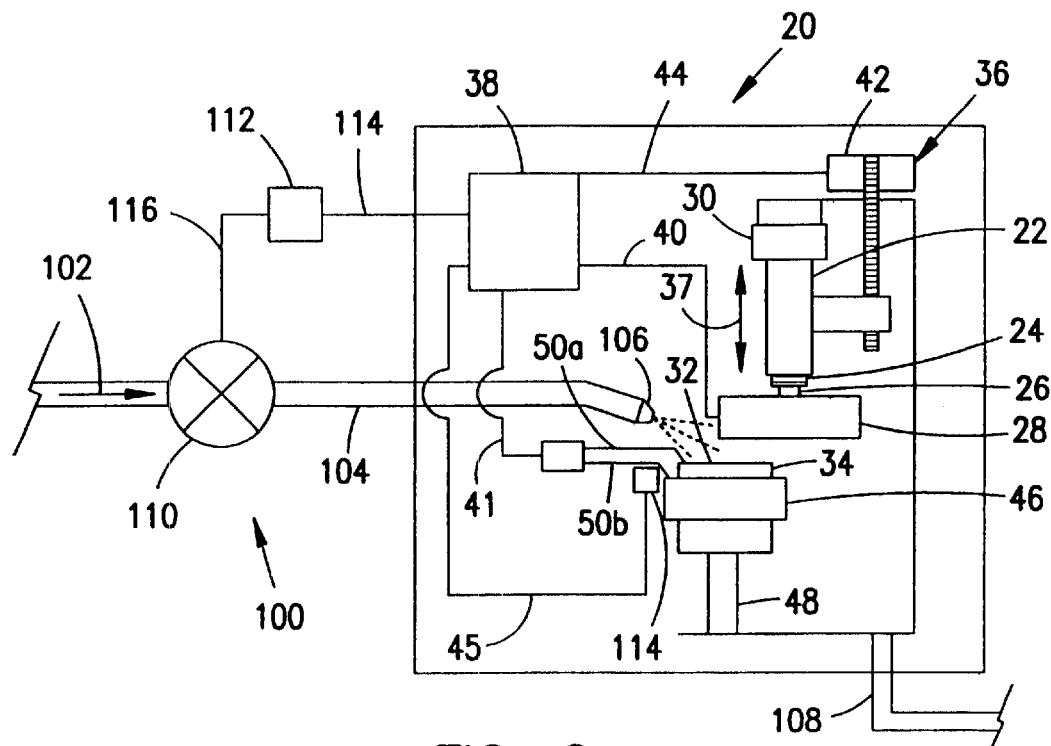
FIG. 2 is a diagrammatic illustration of a wafer grinding machine in accordance with another embodiment of the present invention.

Referring now to FIG. 2, a generic wet grinding machine or grinder 20 suitable for grinding a semiconductor wafer is diagrammatically illustrated. While the particular construction of the grinder 20 is, for the most part, not central to the invention, the basic components will be briefly described. The grinding machine 20 includes a spindle housing 22. The spindle housing 22 includes a spindle 24 having a rotatable grinding shaft 26 and a grinding wheel 28 rigidly secured to the end of the shaft 26. A spindle motor 30 rotates the shaft 26 and thus, the grinding wheel 28 at conventional speeds (e.g., 2400–3000 RPM) during the grinding process such that the grinding wheel 28 grinds away semiconductor material from a backside surface 32 of a wafer 34. The spindle housing 22 is secured to a conventional feed mechanism 36 that permits movement along a direction 37. Thus, the placement and feed rate of the grinding wheel 28 can be adjusted relative to the wafer 34. A machine controller 38, such as a computer, is electrically connected to the grinding wheel 28 by an electrical conductor 40, to a feed rate motor 42 by another electrical conductor 44, and to various other components as described below.

The wafer 34 is secured to a chuck or chuck table 46 by a suitable securing mechanism, such as vacuum suction, as is well understood in the art, with the front side of the wafer (having the integrated circuits positioned thereon) placed against the chuck table 46. The chuck table 46 is in turn secured to a work spindle 48 which is driven by a chuck table motor (not shown) at conventional speeds of (e.g., 50–300 RPM).

The grinder 20 constantly measures the wafer thickness during the grinding process to ensure that only the desired wafer material is removed. To measure wafer thickness, one or more measurement probes 50 coupled to the machine controller 38 by a conductor 41 is used. In one embodiment, a first probe 50a contacts the wafer surface 32 while a second probe 50b contacts a chuck table datum plane. By comparing the two signals produced by the probes 50a, 50b, the exact thickness of the wafer 34 may be determined at any time. As with many transducers, the probes are influenced by temperature variation. As such, they are calibrated to operate within a specific temperature range. Operation outside that range yields inaccurate readings.

The grinder 20 may process one or more wafers at one or more locations within the grinder. Typically, the grinder 20 can receive and store multiple wafers delivered in large "cassettes" (not shown) which are loaded into the grinder 20 manually or by automated methods. A robotic arm on the grinder removes wafers from the cassettes and places them on the chuck table. The robotic arm may also remove wafers from the chuck table and place them into other cassettes at grind completion. With the ability to process multiple wafers simultaneously and the ability to store incoming and outgoing wafers, the grinder can operate in a relatively continuous fashion until the wafer cassettes are exhausted or grinder maintenance is required.

During the grinding process, frictional engagement of the wheel 28 with the wafer surface 32 generates heat. In addition to adversely affecting the probe accuracy (as discussed above), excessive heat can damage the wafers, potentially causing warpage or even breakage. Accordingly, a coolant system 100 is typically provided to deliver coolant over the wafer and grinding wheel during the grinding operation. While various coolants may be used within the scope of the invention, it will be hereinafter described as water. Referring still to FIG. 2, the coolant system comprises a continuous source of pressurized coolant water 102 (either municipal or de-ionized) delivered to the grinder via one or more coolant or water delivery conduits 104. The conduit(s) 104 may terminate at a direction nozzle 106 to provide the desired water dispersion to the wafer 34 and grinding wheel 28. By providing adequate and continuous flow of water, excessive heat energy is removed from the grinder. In addition, by providing water of relatively constant temperature, the grinder components are kept at a relatively constant temperature.

While the water 102 is particularly useful as a cooling medium, it is also beneficial as a carrier to remove dust and particles generated by the grinding process. As with any grinding operation, wafer grinding removes material from the wafer surface. If not effectively transported from the grinder, this material can accumulate and interfere with the grinding operation. By providing the coolant water 102 to the wafer 34 and grinding wheel 28, the material removed from the wafer can be carried from the grinder 20 via a drain 108.

When the grinder completes processing, it enters idle mode. At this point, a conventional grinder allows the operator to terminate the coolant water flow. However, since the water maintains the temperature of all the grinding components, stopping the flow of water permits the temperature of the probes and other components to fluctuate. Accordingly, when the grinder once again enters active mode, the operator must wait until the flow of coolant water returns the grinder to operational temperature. Due to the mass of some of the grinding machine components, it may take some time before this operational temperature is restored.

To avoid this delay, many operators leave the coolant flow on during idle mode. This assures that temperature is maintained and that the grinder can return to operational status with no little or no "warm-up" period. Leaving the coolant flow on also permits better flushing of material from the system. That is, material that is not completely rinsed from the grinder upon entering idle mode can still be removed by the continual coolant flow during idle mode.

While leaving the coolant flow on has distinct advantages, it also wastes water. For example, a typical wafer grinder may be in idle mode a third of the time resulting in a third of the total coolant consumption occurring when no wafers are being processed. Therefore, by reducing the flow rate during idle mode, significant reduction in coolant consumption may be realized.

The present invention provides reduced flow during idle time without adversely impacting the thermal condition of the grinder. Furthermore, the present invention permits elevated coolant flow to continue for a brief period after entering idle mode to ensure adequate cleaning.

Referring still to FIG. 2, the cooling system 100 provides a remotely controlled flow control valve 110 positioned in the conduit 104. The valve 110 has an adjustable opening (not shown) which allows the valve to vary the flow rate of water delivered to the grinder 20. The valve 110 may be a simple solenoid valve that opens and closes in response to an electrical signal. In one embodiment, the machine controller 38 may monitor the status of the grinder 20 and provide a grinder status signal to the valve 110 when the machine enters idle mode. Alternatively, a valve controller 112 may receive status information from the machine controller 38 through a conductor 114 and control the valve 110 via yet another conductor 116 based on the status information. In one embodiment, the valve controller 112 may be either coupled directly to or integral with the valve 110. Alternatively, it may be a separate component. In another embodiment, the valve controller 112 generates a digital signal that is used to trigger a solid state relay on the valve. However, other controllers (e.g., analog) and other valves (e.g., solenoid, servo, proportional) are also possible within the scope of the invention.

Having described the components of the grinder and the coolant system 100, operation of the system will now be described. While the description pertains to a specific exemplary embodiment, other embodiments of a grinder coolant system or, for that matter, other facility conservation systems are also within the scope of the invention.

Still referring to FIG. 2, a wafer 34 is loaded onto the chuck table 46 and ground by the wheel 28. When completed, the robotic arm (not shown) removes the wafer 34 and positions another wafer in its place. This continues throughout the operational or active cycle. During grinding, coolant water 102 is delivered at a first flow rate through the directional nozzle 106. The water is dispersed to the wafer surface 32, maintaining temperature and rinsing removed material therefrom. The waste coolant water is collected and removed through the drain 108. The waste water may be filtered and recycled or may be directly delivered to a waste water system.

When the grinder 20 has completed grinding, it automatically or manually enters idle mode. In idle mode, the motors on the grinder 20 slow to idle speed or may even stop. The machine controller 38 notifies the valve controller 112 via the conductor 114 that the grinder 20 has entered idle mode. At this point, the valve controller 112 begins water conservation procedures. In one embodiment, the valve controller 112 simply commands the valve 110 to stop delivery of water. In another embodiment, the valve controller 112 commands the valve 110 to reduce the flow rate to the minimum required to adequately maintain the grinder temperature. This reduced flow is then provided for the duration of the idle mode. In order to effectively clean the grinder, the valve controller 112 may include a delay circuit which initially delays flow reduction for some finite period of time after the machine switches from active to idle mode. The valve controller 112 or valve 110 may include an adjustment mechanism to permit variation of this delay.

Figure 3:
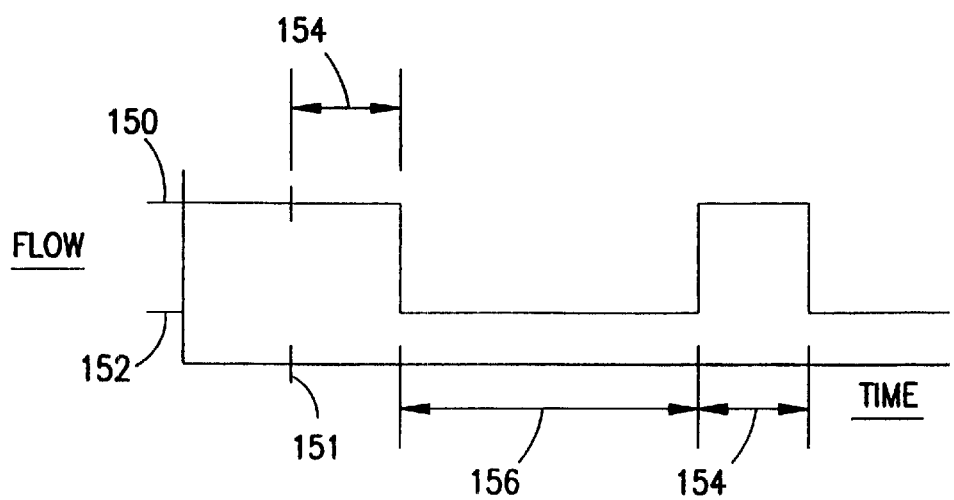
FIG. 3 is a graphical representation of coolant flow during idle mode in accordance with one embodiment of the present invention.

Referring now to FIG. 3, another method of conserving cooling water is illustrated. Here, water flow (y-axis) as a function of time (x-axis) is shown. The valve controller 112 receives notification that the grinder 20 has entered idle mode at 151 and initiates a cyclic water delivery pattern. That is, the valve controller 112 begins modulating the valve to cycle the flow rate. In one embodiment, the flow rate is modulated between a second flow rate 152 and a higher, third flow rate 150. Once the valve controller 112 detects that the grinder 20 has entered idle mode at 151, it commands the valve 110 to deliver water at the third flow rate 150 as shown in FIG. 3. In this particular illustration, the third flow rate 150 is shown as generally equal to the first flow rate (i.e., the flow rate delivered before entering idle mode). However, other embodiments wherein the third flow rate is of a different magnitude than the first flow rate are also possible within the scope of the invention. The third flow rate 150 is provided for a period 154 to flush materials left from previous operations. At the completion of the period 154, the valve controller 112 commands the valve 110 to decrease the flow rate to the second flow rate 152. While the second flow rate 152 may be any quantity less than the third flow rate 150, it is in one embodiment, zero flow. The second flow rate 152 is maintained for a period 156. At the end of the period 156, the valve controller 112 once again commands the valve 110 to deliver water at the third flow rate 150. This entire cycle then repeats for the remainder of the idle mode.

To ensure that the valve 110 remains open during the grinding process, it may be configured as a "normally open" valve. A normally open valve is biased to its open position in the absence of energizing power. In FIG. 3, a normally open valve would be energized or "pulsed" during the period 156 and de-energized during the period 154. A normally open valve is advantageous during grinding in that it permits full coolant flow to continue in the event of a power failure. Although the valve 110 is described herein as normally open, water conservation systems wherein the valve is "normally closed" (i.e., must be energized to open) are also within the scope of the invention.

The profile or duty cycle shown in FIG. 3 is dependent on many factors but should be selected to ensure that the grinding machine temperature (including the probes 50a, 50b) is adequately maintained. The frequency and duration of the period 156 and the magnitude of the third flow rate 150 may be adjusted by conventional adjustment methods including, for example, potentiometers (not shown) on the valve controller 112 or the solenoid valve 110. By maximizing the frequency and duration of the period 156, water usage during idle mode is minimized.

Other water conservation methods are also possible within the scope of the invention. For example, while the valve controller described above is reactive to the operational status of the grinder, other sensors may also provide feedback to the valve controller 112. For example, thermocouples 114 as shown in FIG. 2 could monitor the temperature of various components such as the probes 50 during idle mode and relay that information to the machine controller 38 and valve controller 112 through a conductor 45. Once the temperature reaches a threshold value, the controller 112 could open the valve 110. When the thermocouples 114 indicate that the temperature has once again returned to an acceptable range, the controller 112 could be informed whereby the valve 110 would once again close.

The actual savings realized from utilizing a water conservation system are highly dependent on the particular grinder and the percentage of time spent in idle mode. For example, a grinder that is idle approximately 36% of the time may, in one embodiment, realize estimated water savings of about 20–36% (depending on the duty cycle and the time delay before reduced flow is initiated) over systems that provide continuous flow. The actual savings would depend on many factors including coolant and ambient temperature, duration of delay, coolant dispersion, mass of components to be cooled, and temperature range which must be maintained.

Advantageously, the present invention can effectively reduce consumption of a facility provided to equipment which periodically enters a non-operational idle mode. By monitoring the status of the equipment, the delivery of the facility may be reduced or terminated when the equipment enters idle mode. To maintain the operational readiness of the machine and eliminate the need for a subsequent "warm-up" period, the delivery of the facility may be periodically restored or increased during idle mode. In addition, a delay may be provided so that elevated delivery of the facility is maintained momentarily after entering idle mode. Accordingly, the present invention permits facility conservation during idle mode without the undesirable consequences that may result from total facility termination.

Exemplary embodiments of the present invention are described above. Those skilled in the art will recognize that many embodiments are possible within the scope of the invention. Variations, modifications, and combinations of the various parts and assemblies can certainly be made and still fall within the scope of the invention. Thus, the invention is limited only by the following claims, and equivalents thereto.

What is claimed is:

1. A method of conserving water delivered to a machine, the method comprising:
    delivering water to the machine with a water delivery conduit;
    providing a flow control valve between the water delivery conduit and the machine; and
    adjusting the flow rate of the water with the flow control valve wherein water is delivered at a first flow rate when the machine is in an active mode and at a second, reduced flow rate when the machine is in an idle mode.

2. The method of claim 1 further comprising modulating the flow rate of water to the machine when the machine is in idle mode whereby the flow control valve intermittently increases the flow rate of water to a level higher than the second flow rate.

3. The method of claim 1 further comprising delaying the transition from the first flow rate to the second flow rate by a finite time period after the machine switches from active to idle mode.

4. A method of conserving water delivered to a machine, the method comprising:

delivering water to the machine with a water delivery conduit;

providing a flow control valve between the water delivery conduit and the machine;

adjusting the flow rate of the water with the flow control valve wherein water is delivered at a first flow rate when the machine is in an active mode and at a second, reduced flow rate when the machine is in an idle mode; and modulating the flow rate of water to the machine when the machine is in idle mode whereby the flow control valve intermittently increases the flow rate of water to a level higher than second flow rate.

5. The method of claim 4 wherein modulating the delivery further comprises:

maintaining the second flow rate for a first period;

elevating the facility delivery to a third flow rate for a second period; and returning to the second flow rate.

6. The method of claim 5 wherein the third flow rate is substantially equal to the first flow rate.

7. The method of claim 5 wherein one or more of the first period, second period, and third flow rate are adjustable.

8. A method of conserving water delivered to a machine, the method comprising:

delivering water to the machine with a water delivery conduit;

providing a flow control valve between the water delivery conduit and the machine;

adjusting the flow rate of water with the flow control valve wherein water is delivered at a first flow rate when the machine is in an active mode and at a second, reduced flow rate when the machine is in an idle mode;

delaying the transition from the first flow rate to the second flow rate by a finite time period after the machine switches from active to idle mode; and modulating the flow rate of water to the machine when the machine is in idle mode whereby the flow control valve intermittently increases the flow rate of water to a level higher than second flow rate.

\* \* \* \* \*